US009527274B2

(12) United States Patent
Oleson

(10) Patent No.: US 9,527,274 B2
(45) Date of Patent: Dec. 27, 2016

(54) APPARATUS INCLUDING A REGISTRATION SYSTEM FOR PREPARING A SCREEN PRINTING SCREEN

(71) Applicant: M&R Printing Equipment, Inc., Glen Ellyn, IL (US)

(72) Inventor: Andrew L. Oleson, Carol Stream, IL (US)

(73) Assignee: M&R Printing Equipment, Inc., Roselle, IL (US)

(*) Notice: Subject to any disclaimer, the term of this patent is extended or adjusted under 35 U.S.C. 154(b) by 0 days.

(21) Appl. No.: 14/887,673

(22) Filed: Oct. 20, 2015

(65) Prior Publication Data

US 2016/0039197 A1 Feb. 11, 2016

Related U.S. Application Data

(62) Division of application No. 14/060,172, filed on Oct. 22, 2013.

(60) Provisional application No. 61/791,300, filed on Mar. 15, 2013.

(51) Int. Cl.
| B41F 15/34 | (2006.01) |
| B41M 1/12 | (2006.01) |
| B41C 1/14 | (2006.01) |
| G03F 1/00 | (2012.01) |
| G03F 7/12 | (2006.01) |
| G03F 7/20 | (2006.01) |

(52) U.S. Cl.
CPC .............. *B41F 15/34* (2013.01); *B41C 1/147* (2013.01); *B41M 1/12* (2013.01); *G03F 1/0023* (2013.01); *G03F 7/12* (2013.01); *G03F 7/2018* (2013.01); *B41M 2205/14* (2013.01)

(58) Field of Classification Search
CPC ...... B41M 2205/14; B41M 1/12; B41C 1/147; G03F 1/0023
USPC .............. 101/129, 128.21, 128.4, 127, 127.1
See application file for complete search history.

(56) References Cited

U.S. PATENT DOCUMENTS

| 5,156,089 | A | * | 10/1992 | McCue ................... B41C 1/147 |
| | | | | 101/128.4 |
| 5,875,712 | A | | 3/1999 | Ericsson et al. |
| 5,921,176 | A | | 7/1999 | Oleson |
| 5,943,953 | A | | 8/1999 | Oleson |
| 5,953,987 | A | * | 9/1999 | Oleson ................ B41F 15/0863 |
| | | | | 101/126 |
| 6,927,014 | B1 | | 8/2005 | Figov |
| 2002/0192569 | A1 | | 12/2002 | Ulland et al. |
| 2005/0072325 | A1 | | 4/2005 | Baxter et al. |

(Continued)

FOREIGN PATENT DOCUMENTS

| EP | 0492351 A1 | 7/1992 |
| EP | 1245400 A1 | 10/2002 |

(Continued)

OTHER PUBLICATIONS

International Search Report for PCT/US2014/028114 mailed Sep. 3, 2014 (4 pages).

(Continued)

*Primary Examiner* — Leslie J Evanisko
(74) *Attorney, Agent, or Firm* — Nixon Peabody LLP

(57) ABSTRACT

A system or machine is disclosed which takes pre-stretched emulsion coated screens, digitally prints thereon and exposes them before further processing and use in a screen printing machine.

18 Claims, 13 Drawing Sheets

(56) References Cited

U.S. PATENT DOCUMENTS

2006/0098235 A1* 5/2006 Bourne ............... B41C 1/147
358/3.29
2008/0047445 A1   2/2008 Berner
2014/0261029 A1   9/2014 Oleson

FOREIGN PATENT DOCUMENTS

| EP | 2395396 A2 | 12/2011 |
|----|-----------|---------|
| WO | 0077576 A1 | 12/2000 |
| WO | 2014143928 A1 | 9/2014 |

OTHER PUBLICATIONS

Written Opinion of International Searching Authority for PCT/US2014/028114 mailed Sep. 3, 2014 (6 pages).
Brochure for "i-Image ST Computer-to-Screen Imaging System"; M&R Printing Equipment, Inc.; published Oct. 24, 2012 (2 pages).
Brochure for "Tri-Light Multi-Spectrum Screen Exposure System"; M&R Printing Equipment, Inc.; published Oct. 1, 2008 (2 pages).
European Patent Office, Third Party Observation, identifying U.S. Pat. No. 5,875,712, in EP Application No. 14721111.4, mailed Jun. 22, 2016 (12 pages).

\* cited by examiner

APPARATUS INCLUDING A REGISTRATION SYSTEM FOR PREPARING A SCREEN PRINTING SCREEN

CROSS-REFERENCE TO RELATED APPLICATIONS

The present application is a divisional of U.S. patent application Ser. No. 14/060,172 filed Oct. 22, 2013, which claims the benefit of U.S. Provisional Patent Application No. 61/791,300 filed Mar. 15, 2013, the contents of which are incorporated herein by reference.

FEDERALLY SPONSORED RESEARCH OR DEVELOPMENT

N/A

FIELD OF THE INVENTION

The present invention relates to a printing screen used in screen printing and the preparation thereof in a system that receives an emulsified coated screen and produces an exposed pattern thereon that can be processed by spraying and drying and then used on the screen printing machine.

DESCRIPTION OF THE PRIOR ART

Indicia applied permanently to articles of clothing and other textiles have become very popular. Fanciful indicia, such as logos, slogans, college names, sports team names and sayings, are now commonplace. As a result, screen printing has become very popular. Large, commercial operations screen printing textiles are common today.

Indicia can be one or more colors. Typically, a screen printing machine has at least one station for each color employed. For example, a design incorporating two colors will have at least two printing stations, one for each color. A design employing eight colors will have at least eight stations. Each station generally includes a printing head, which supports a single screen, the ink to be used at that station and a mechanism for applying the ink to the textile. Each color is carried by a single screen. The textile to be screened travels from printing station to printing station by one of a number of methods, such as a chain or a rigid arm. The textile is usually carried by a metal pallet, pallet support, flat bed, or platen. Common printing machines include turret, oval and linear. In addition to printing stations, there may also be curing stations to heat and set the inks placed on the textile or substrate.

The general process for setting-up the screens for printing follows:

First, the artwork is set up. The artwork, in the form of a film positive, is secured on a layout board. Next, a carrier sheet (optically clear polyester film) is placed on the layout board. An individual separates the colors by transferring the artwork by hand to one or more carrier sheets. In this separation/transference process, each carrier sheet represents a separate color to be used in the final screened textile. Thus, if there are six (6) colors being screened, there will be six (6) carrier sheets (Art Separations) completed.

Second, the stenciled screens are made (one for each color or print head). The indicia or design is formed in the screen by a conventional process. The mesh of the screen is generally covered with an ultraviolet sensitive emulsion and put into a vacuum exposure unit, basically having a light source, a vacuum, a cover, and a table disposed therebetween. Each carrier sheet is aligned with an emulsion covered, pre-stretched screen such that the carrier sheet is disposed between the light source and the screen. The cover is closed and the screen/carrier sheet combination is subjected to a vacuum, to bring them into contact with one another, and UV light. The exposed screen is then chemically processed resulting in a printing screen. With modern techniques and chemicals, processing can be performed by applying a water spray, often a high power water spray, to the exposed screen.

When exposed to ultraviolet (UV) light and processed (often by a power water spray), those portions or mesh of the screen covered (such as by stencil) are left open (interstices are formed), permitting light, paint, or ink to pass through the mesh. Those portions of the screen mesh not covered by a stencil, once exposed and processed, become opaque, blocking the passage of light, paint, or ink through the mesh.

Specifically, those parts of the mesh not exposed to the UV light (the unexposed stencil/design) wash away and produce openings or interstices in the mesh for the ink to pass therethrough during the printing process. The interstices in screen represent the places where ink of a particular color is to be deposited onto the textile or other substrate.

Third, each printing screen is secured to a printing head. One color of ink is then placed into the each printing head.

With automated equipment, the textiles, one at a time, are loaded onto the travelling pallets and the pallets travel to each of the printing stations, each station having a different color of ink therein. The ink is applied to each textile through the screen at each station. Each textile is cured and the ink permitted to set.

SUMMARY OF THE INVENTION

The present invention eliminates many of the steps described-above. The improved process of the present invention is as follows:
1) The design is entered and stored into a computer associated with a machine.
2) On the computer, a designer/artist separates the design into individual color silhouettes, each silhouette representing a color and an individual screen.
3) Pre-stretched screens are individually coated with a UV sensitive emulsion.
4) The pre-stretched, emulsion coated screens are individually loaded into the machine.
5) For each screen, the machine takes the design associated with the color for that screen in the computer and digitally prints it on the emulsion coated screen for that color.
6) Each emulsion coated screen is then exposed in the machine.
7) Each exposed screen is then removed from the machine.
8) Each removed exposed screen is then processed (chemically or by power spraying with water).
9) Each screen is dried mechanically, electronically, or naturally.

In a second embodiment, the steps identified as Nos. 3 (Coating), 8 (Processing), and 9 (Drying) can be added to the machine so that the process becomes:
1) The design is entered and stored into a computer associated with a machine.
2) On the computer, a designer/artist separates the design into individual color silhouettes, each silhouette representing a color and an individual screen.

3) Pre-stretched screens are individually loaded into the machine.
4) The machine individually coats each screen with a UV sensitive emulsion.
5) For each screen, the machine takes each design in the computer representing each color and digitally prints it on each emulsion coated screen for each color.
6) Each emulsion coated screen is then exposed in the machine.
7) Each exposed screen is then processed (chemically or by power spraying with water).
8) Each screen is dried mechanically, electronically, or naturally.
9) Each exposed dried screen is then removed from the machine.

Another aspect of the present invention is directed to a method of preparing a screen for a screen printing machine comprising the steps of: (1) providing a digital printing machine comprising: a reservoir for holding a supply of an ultra-violet light blocking agent; an applicator in fluid communication with the reservoir; a screen bed in operative alignment with the applicator; and a source of ultra-violet light in operative alignment with the screen bed; (2) receiving a digitally encoded design with the digital printing machine; (3) loading a pre-stretched screen having an ultra-violet light sensitive emulsion coating a surface thereof onto the screen bed; (4) providing a first relative movement between the screen bed and the applicator while the screen is on the screen bed; (5) applying a quantity of the ultra-violet light blocking agent to the ultra-violet light sensitive emulsion coating during the providing the first relative movement step; (6) providing a second relative movement between the screen bed and the source of ultra-violet light while the screen is on the screen bed and subsequent to the ultra-violet light blocking agent application to the ultra-violet light sensitive emulsion coating; and (7) exposing the ultra-violet light sensitive coating and the ultra-violet light blocking agent to the source of ultra-violet light during the second relative movement step.

This aspect of the present invention may comprise one or more of the following features, alone or in any reasonable combination. The exposing step may be performed until a first portion of the ultra-violet light sensitive coating is substantially solidified and a second portion of the ultra-violet light sensitive coating beneath the ultra-violet light blocking agent and the ultra-violet light blocking agent remain at least substantially flowable. The exposing step may be performed continuously as the pre-stretched screen traverses on the screen bed. The source of ultra-violet light may comprise a narrow band of light emitting diodes, and the exposing step may include exposing only narrow portions of the pre-stretched screen continuously until a desired area of the surface of the pre-stretched screen is exposed during the second relative movement. The source of ultra-violet light may operate on a wavelength wherein a first region of a layer of the ultra-violet light sensitive emulsion on the pre-stretched screen solidifies when exposed thereto and wherein a second region of the layer of the ultra-violet light sensitive emulsion masked by the ultra-violet light locking agent remains substantially flowable when exposed thereto. The exposure step may be performed in less than one minute. A gap between the source of ultra-violet light and the surface of the pre-stretched screen may be less than one inch. The wavelength of the source of ultra-violet light may be between 360 and 400 nanometers. The method may further comprise the step of rinsing the pre-stretched screen with a pressurized fluid subsequent to the exposing step exposed screen wherein a portion of the ultra-violet light sensitive emulsion that was exposed to the source of ultra-violet light remains on the pre-stretched screen and a portion of the ultra-violet light sensitive emulsion beneath the ultra-violet light blocking agent is removed by the rinsing step.

Another aspect of the present invention is directed to an apparatus for preparing a screen for a screen printing machine. The apparatus comprises an interface for receiving commands from a computer; a housing; a reservoir for holding a supply of an ultra-violet light blocking agent attached to the housing; a print head in fluid communication with the reservoir attached to the housing; a screen bed alignable with the print head; a means for providing relative movement between the print head and the screen bed along a two dimensional plane attached to the housing; and a source of ultra-violet light attached to the housing and operating on a wavelength wherein a first region of a layer of emulsion deposited on an emulsion-coated, pre-stretched screen solidifies when exposed thereto and wherein a second region of the layer of emulsion masked by the ultra-violet light locking agent remains substantially flowable when exposed thereto.

This aspect of the invention may include one or more of the following features, alone or in any reasonable combination. The apparatus may further comprise a print head carrier capable of providing movement to the print head over a two-dimensional plane in response to commands received from the computer. The apparatus may further comprise a registration system for aligning a pre-stretched screen on the screen bed with the print head. The wavelength of the source of ultra-violet light may be between 360 and 400 nanometers. The apparatus may further comprise an ultra-violet light blocking agent within the reservoir wherein the ultra-violet light blocking agent remains at least substantially flowable after an exposure to an ultra-violet light. The exposure may have a duration of less than one minute.

Other features and advantages of the invention will be apparent from the following specification taken in conjunction with the following drawings.

BRIEF DESCRIPTION OF THE DRAWINGS

To understand the present invention, it will now be described by way of example, with reference to the accompanying drawings and attachments in which.

DETAILED DESCRIPTION

Figure 1:
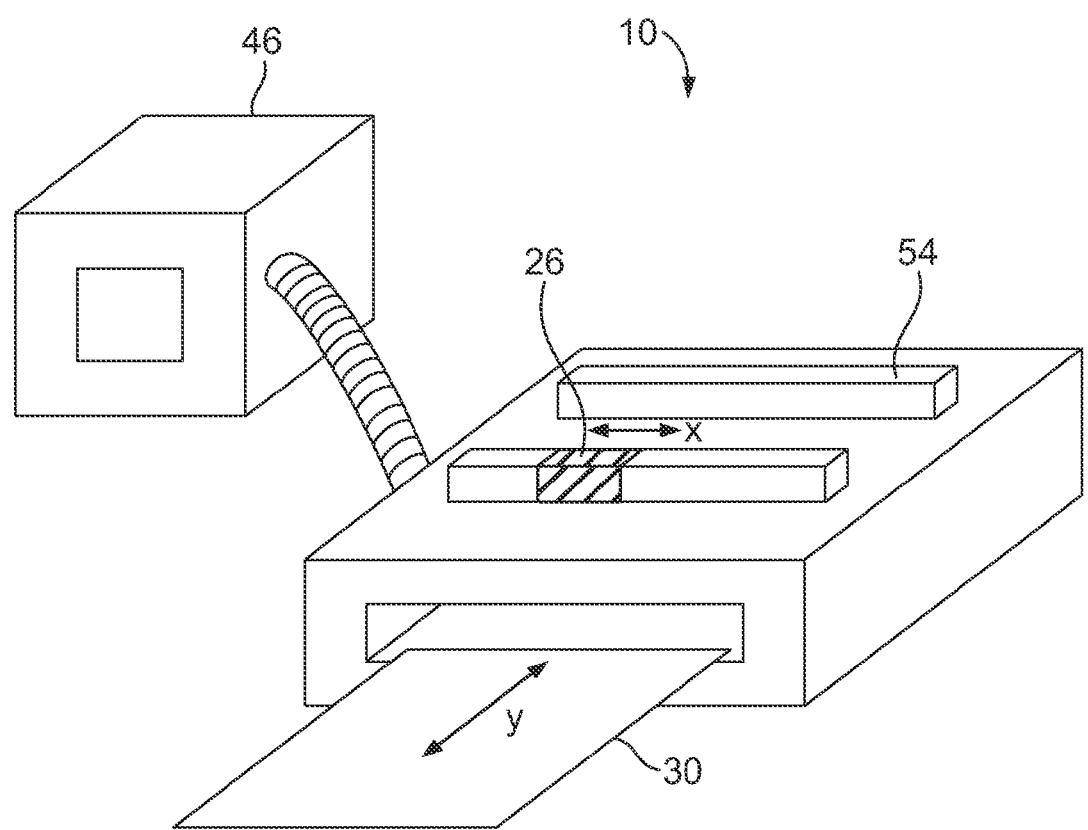
FIG. 1 is schematic-view of an embodiment of the present invention.
Figure 2:
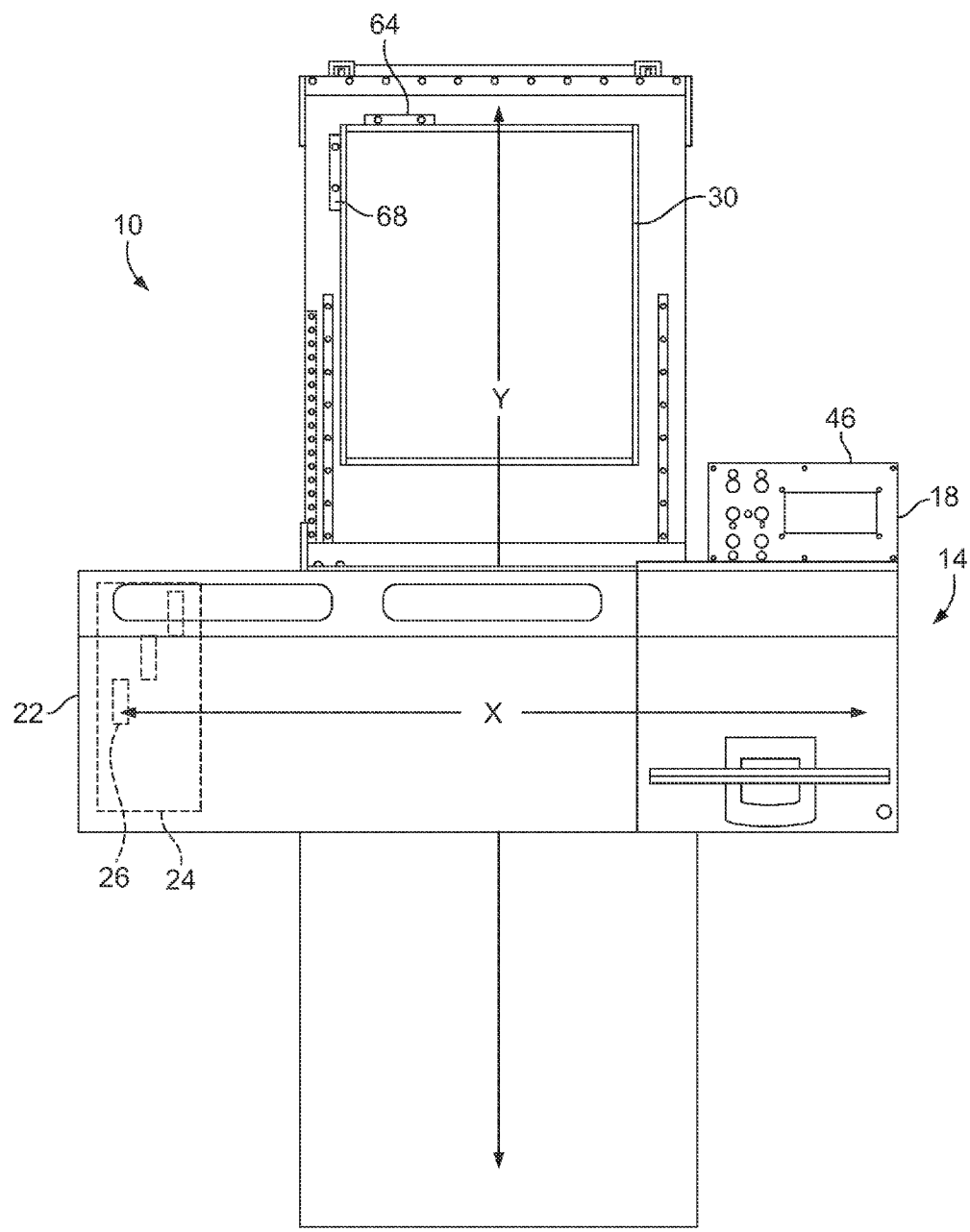
FIG. 2 is a top view of an embodiment of the present invention.
Figure 3:
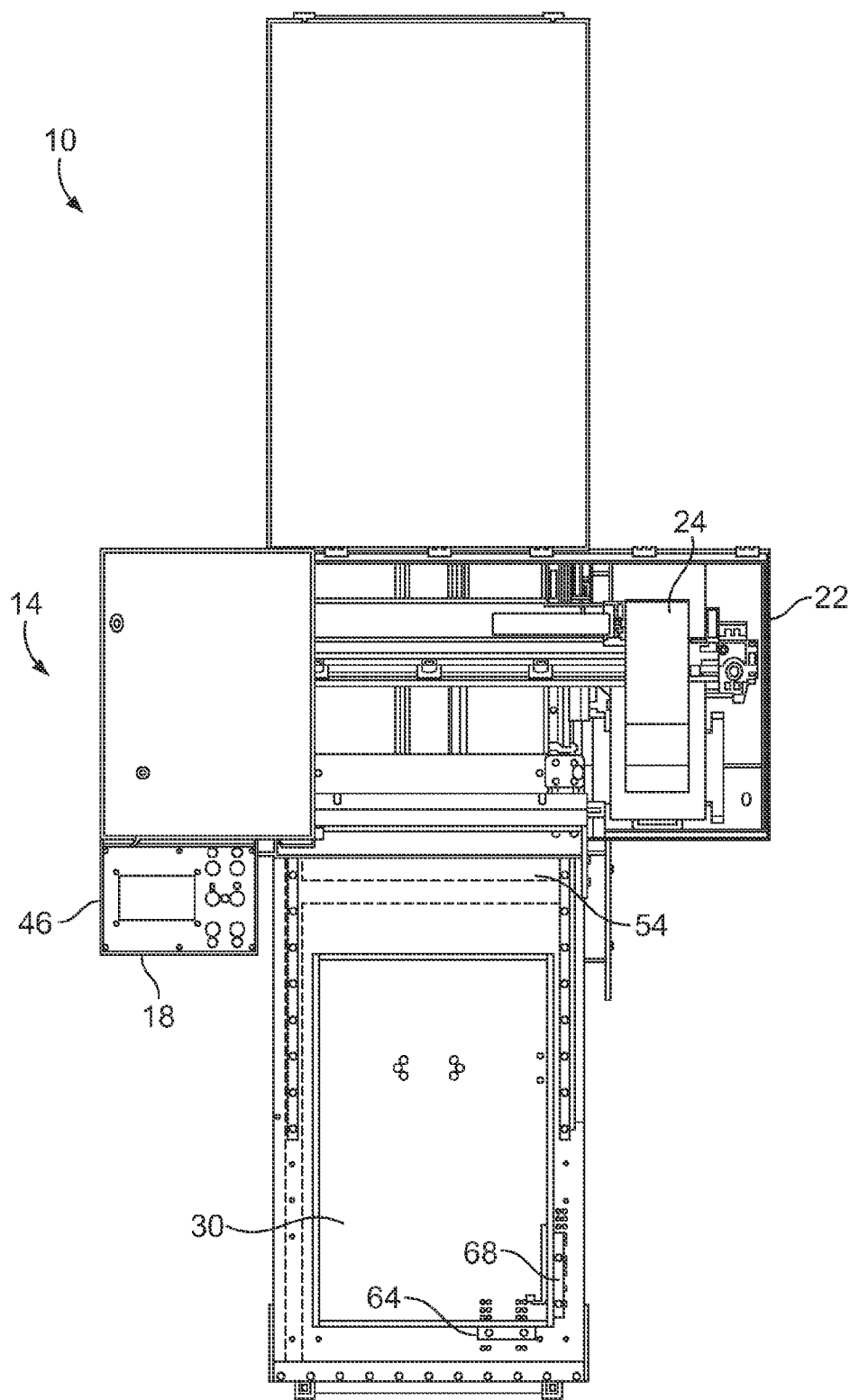
FIG. 3 is a top view of an embodiment of the present invention.
Figure 4:
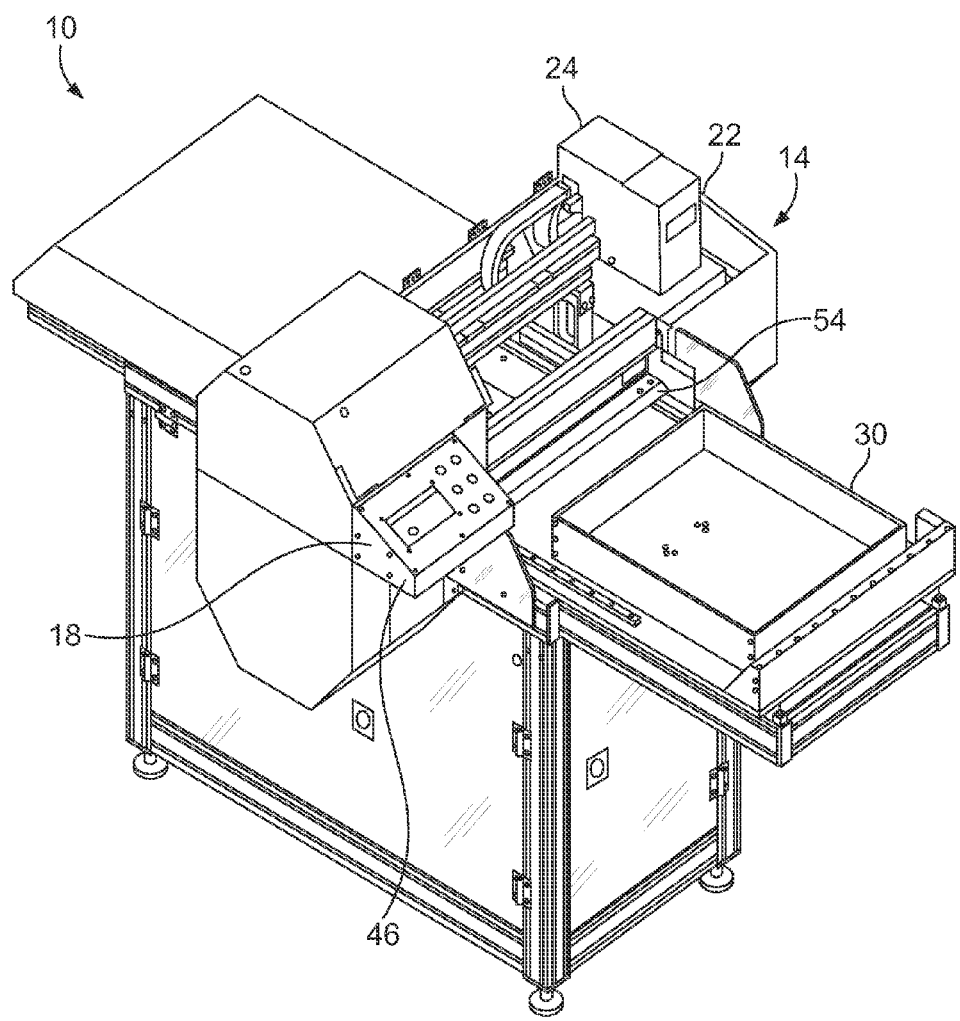
FIG. 4 is a perspective view of the embodiment of FIG. 3.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The primary components of the system or machine 10 include the following:

Housing (Controls, Printing, and Exposing)

The housing system 14 is based on M&R Printing's i-IMAGE line of computer-to-screen imaging system. It comprises framework, supports, connectors, attachments, covers, shielding, etc. to protect and support the apparatus 10 components within the overall apparatus 10. It includes two portions, a portion to hold the controls and a portion to hold the printing and exposing assembly.

Control Housing

The control housing 18 includes the primary electronics for the system (the controller and software) and the controls and buttons (keypad, mouse, etc.) for controlling the print jobs, and is connected to a power source and a monitor (for visually displaying the operator's work and/or choices via a screen).

The electrical requirements of the system is 208/230 V, 1 ph, 5 A, 50/60 Hz, 1.15 kW. The use of an uninterruptable power supply (UPS) is preferable. A 110 V electrical configuration can also be integrated.

Printer Housing

The printer housing 22 can be made integral with the control housing and includes the printer assembly which supports a moveable carriage 24 carrying one or more printer heads 26 and a moveable screen bed 30 for horizontally supporting a screen 34 being printed upon. The housing further has a front opening therein for receiving the screen bed 30 with the screen 34 positioned thereon and therein and for discharging the screen bed 30 and screen 34 back out. In another embodiment, a second opening and rear housing can be added for discharging the screen 34 and/or permitting the screen 34 to pass under an ultra-violet light.

It should be noted that the printer housing 22 is a light sensitive environment meaning it minimizes the amount of light permitted to enter the housing's inner chamber(s). A rear housing, if employed, is similarly constructed so as to maintain the light sensitive environment.

Printer

The system uses one or a plurality of applicators in fluid communication with a reservoir holding a supply of an ultra-violet light blocking agent 38. The applicators are generally print heads 26, preferably 1 to 3, that move laterally back and forth as the screen bed 26 moves longitudinally. Specifically the printer heads 26 move in the X-X (cross) direction while the screen bed 30 and screen 34 move in the Y-Y direction. Advanced high-resolution inkjet technology is used to quickly generate opaque images on emulsion-coated screens 34.

The distance between the printer head 26 and the screen 34 is to be kept very small. It is about 1½ millimeters.

The printer heads 26 can move unidirectional or bidirectional when laying down chemicals. While unidirectional motion laying down the ink is slower, it is often more effective with more detailed designs or smaller mesh sizes.

Preferably, the printer head(s) 26 deliver a quantity of an ultra-violet light blocking agent 38, preferably a type of ink to an emulsion-coated, pre-stretched screen. The ultra-violet light blocking agent 38 is a photo resist, preventing an ultra-violet exposure light 100 from reaching an emulsion 42 in the area that has been printed with the ultra-violet light blocking agent 38. The ultra-violet light blocking agent 38 prevents a cross-linking process of the emulsion 42 under the blocking agent 38, and leaves the emulsion 42 below the ink water soluble, so that it is easily washed away during a water rinse process, creating the printing stencil in a desired image to be later screen printed.

Alternatively, the printer head(s) 26 do not contain ink. Rather the printer heads support a chemical that reacts with the emulsion 42 on the screen when exposed to ultra-violet light.

It has been found that computer-to-screen images are superior to traditional film positives, delivering greater detail and smoother halftone transitions. Since the image is made directly on the screen, there is no need for vacuum hold-down during the exposure process. This, coupled with the fact that ultra-violet light does not have to penetrate layers of film and glass, can reduce exposure time up to half. There is no need for costly film positives, as well as the space and labor required to store and retrieve them. Because the image information is digital, it is easy to store and quick to retrieve.

Software

Using controls on the system, a design is entered into a computer 46 of the system manually or by other means such as a disc, USB Drive, internet connection, etc. A designer/artist then separates the design into individual color silhouettes 50, each silhouette 50 representing a color and an individual screen 34. To accomplish this, the system includes an interface such as a computer 46 with a monitor connected thereto and raster image processing (RIP) software. In essence, the RIP software permits conversion of type, vector graphics, continuous tone images, screens and all other content into a high resolution grid of binary pixels that the printer (e.g., laser, ink jet, dot matrix, etc.) will render onto a printing plate. The RIP software performs the functions of interpretation, rasterisation and color/screen separation. The software interprets the commands in a formatted code, such as Adobe PostScript and PDF, and redraws the objects and elements as vector graphics. In rasterisation, the independent vector shapes are then converted into pixels (a bitmap). Then, the raster image undergoes separation to form individual screens. For example a 5080 dots per inch grid at a size of 40"×30" with various pixels turned on or off. This is a printing plate. Since a printing press cannot print continuous tone, these tiny little dots create the illusion of continuous tone.

By providing complete control of the print parameters, the RIP software ensures high-quality images at production-level speed. It provides full image scaling and positioning, has presets for common applications, and can be user-customized for specific art types and various mesh counts.

The printing apparatus 10 receives or uses a digitally encoded design or color silhouette 50 and uses the print head 26 to transfer an ultra-violet light blocking agent 38 to a pre-stretched screen 34.

Screen Bed

Screens 34 are processed with the emulsion 42 facing upward (i.e. on an upper surface of a pre-stretched screen 34), the side with a source of light (described below) and the printer heads 26. The screen bed 30 is sized so as to support a maximum frame profile of 4.1×4.1 cm (1.625"×1.625") and a maximum frame size of 66×91 cm (26"×36"), and a maximum image area of 51×53 cm (20"×21"). The bed 30 moves longitudinally in a Y-Y direction into and out of the housing, generally in operative alignment with the applicator. While moving, the print head(s) 26 is printing onto the emulsion coated screen 34 and moving in an X-X direction. The screen bed 30 has a biasing mechanism therein so that screens of different sizes can be processed and to ensure uniform registration of each screen being processed.

A means for providing relative movement between the screen bed 30 and the applicators may provide movement to either or both of the applicators and the screen bed 30. Preferably, the applicators move in an X-X direction while the screen bed traverses in a Y-Y direction. This is a typical relative movement provided by most printers in the industry. It should be understood that any type or mechanism providing the desired relative movement can be substituted for the preferred action described here.

Ultra-Violet Light Blocking Agent

The ultra-violet light blocking agent 38 is delivered by the applicator or applicators. The ultra-violet light blocking agent 38 is preferably applied to a pre-stretched screen 34 while relative movement between the screen 34 and the applicator takes place. The blocking agent 38 is preferably an ink, such as a specially-formulated i-Pak water-based ultra-violet light blocking ink. Regardless of the type of particular agent 38 used, the ultra-violet light blocking agent 38 will be substantially unaffected by exposure to a source of ultra-violet light 54 at least over the duration of a preselected or predetermined exposure time. This will be explained in more detail below.

Registration System

The bed 30 for the screens incorporates a three-point registrations system thereon. Thus, screens 34 for multicolor jobs are quickly generated in perfect registration. The system employed is an appropriately-sized TRI-LOC pallet system described and claimed in M&R's U.S. Pat. Nos. 5,921,176; 5,943,953; and 5,953,987, the contents of which are hereby incorporated by reference as if fully set forth herein. The TRI-LOC pallet system permits the quick and accurate registering of the screens on the bed and on the press. The entire process—from screen imaging to the first finished print—is dramatically shortened by this process and procedure, with registration time greatly reduced.

In an illustrated embodiment, the registration system includes three points of contact with the screen 34. The screen 34 is introduced into a slot 58 in the Y-Y direction unit it engages a spring-loaded barrier 62. The spring-loaded barrier 62 is biased outwardly relative to the print heads 26 and internal workings of the printer. The screen 34 is forced forward against the force of the spring-loaded barrier 62 and snap fit within perpendicularly oriented retainers 64,68 on the printer at an opposite end of the screen 34, one retainer 64 aligned parallel to a rearward edge of the screen 34 and one retainer 68 aligned perpendicular to the rearward edge of the screen 34. The spring-loaded barrier 62 then provides a force to the screen 34 against the retainer 68 aligned parallel to the rearward edge of the screen 34. This provides registration or alignment of the screen 34 with the print head 26.

Screen

The screens 34 used are pre-stretched and are well-known in the art. One such screen stretcher is the MAX NEWTON offered by M&R. This is an economical pneumatic screen stretcher that delivers high-tension stretching on virtually any mesh/frame combination. The MAX NEWTON's air cylinders compensate for variations in mesh elasticity and fully extend after tensioning. Warp and weft are independently tensioned and controlled, and the durable PVC-coated locking bars grip tightly without tearing mesh.

Before being placed into the device, the pre-stretched screens 34 are individually coated with an ultra-violet light sensitive emulsion 42. When such an emulsion is exposed to a UV light source a chemical reaction called crosslinking occurs. Crosslinking is a bonding process, an interlocking of molecular chains. It can be described as the ability of a material to form a skin. To cause a solution to crosslink, you need a catalyst. The catalyst that makes direct emulsions crosslink comes from the energy supplied by UV light. The part of the emulsion that reacts to the UV is the sensitizer.

One emulsion used is ULANO RLX Multi-Purpose Diazo Photopolymer Emulsion made by Ulano Corporation, 110 Third Avenue, Brooklyn, N.Y. 11217 (USA) (www.ulano.com). RLX is a multi-purpose high speed Diazo photopolymer direct emulsion. RLX's very high solids content provides better stencil build per coat, excellent bridging of coarse mesh, and faster drying. RLX has superb coating properties and durability, and is resistant to a wide variety of solvent- and water-based ink systems. RLX/CL is supplied clear for easier see-through registration. RLX is recommended for imprinted sportswear, P-O-P, and advertising specialty printing.

It should further be noted that mesh sizes for screens 34 range from about 86 threads per inch (TPI) to about 305 threads per inch (TPI). The 305 TPI requires less exposure because less emulsion is on the screen.

It should also be noted that the emulsion 42 coating the screen 34 must be dried before it is exposed. Practice is to always dry in a horizontal position to allow gravity to "pull" the emulsion coating to the garment side of the screen. In addition, when spraying the screens 34 after exposing them, the practice is to vertically orient the screens 34.

Light Bank

A source of ultra-violet light 54 is attached to the housing 22. One or more banks of ultra-violet light are provided within the housing. Thus, once the pre-stretched screen 34 is printed upon using the ultra-violet light blocking agent 38, it is exposed to an ultra-violet light emitted from the source of ultra-violet light 54 for a predetermined length of time, typically less than a minute. The light bank can be a single light source, like a fluorescent ultra-violet light tube, a row of lights, or an array of lights.

In one embodiment, the light source 54 is at the front of the housing 22, generally in operative alignment with the screen bed. It can, of course, be positioned in the back of the housing if a rear housing is used. One embodiment of the present invention is 36 inches wide (in the X-X direction) and 7 inches deep and comprises light emitting diodes (LED). The light source 53 can be, but is not limited to LED lights, CFL bulbs of ultraviolet frequency, Multi-Spectrum Metal Halide, fluorescent, and incandescent light sources. The distance between the screen 34 and the source 54 can vary recognizing that as the distance between the screen 34 decreases, the heat generated by the bulb and screen 34 increases.

In another embodiment, the light source 54 is at the front of the housing relative to the print head 26. In this embodiment, the source 54 is about 29.63 inches wide (in the X-X direction) and 2.07 inches deep and comprises a plurality of LEDs 72. The light source 54 can be, but is not limited to LED lights 72, CFL bulbs of ultraviolet frequency, Multi-Spectrum Metal Halide, fluorescent, and incandescent light sources. The LEDs 72 are arranged in rows and angled columns to provide suitable ultra-violet light exposure coverage to a passing screen, preferably about a 30% overlap from of one row of LEDs to the next. This arrangement promotes elimination of ultra-violet gaps during exposure, which reduces or eliminates "striping," where uneven exposure of the emulsion takes place, post-exposure. The distance between the screen and the source 54 can vary recognizing that as the distance between the screen 54 decreases, the heat generated by the bulb and screen 34 increases. Preferably, a gap of less than one inch is created between the source of ultra-violet light 54 and a surface of the pre-stretched screen 34 coated with the ultra-violet light sensitive emulsion 42 and the ultra-violet light blocking agent 38. More preferably, the gap is on the order of one-eighth of an inch.

The source of ultra-violet light 54 preferably operates or emits light at a wavelength between 360 and 400 nanometers. When exposing the printed screen 34, the desired wavelength will have the effect of substantially solidifying a first region 76 of a layer of the ultra-violet light sensitive emulsion 42 on the pre-stretched screen 34 while a second region 80 of the layer of the ultra-violet light sensitive emulsion 42 masked by the ultra-violet light locking agent 38 remains substantially flowable.

A means for providing relative movement between the ultra-violet light source 54 and the screen bed 30 is generally provided. In the embodiments, illustrated Y-Y movement is provide to the screen bed 30 using the same mode as described in the printing step, namely a motor drives the screen bed 30 in the Y-Y direction based on commands received via the interface.

Thus, exposure of the surface of the pre-stretched screen 34 coated with the ultra-violet light sensitive emulsion 42 having portions of the emulsion masked or blocked by the ultra-violet light blocking agent 38 may be performed continuously as the pre-stretched screen 34 traverses on the screen bed 30. When the source of ultra-violet light 54 comprises a narrow band of LEDs 72, the exposure process includes exposing only narrow portions of the pre-stretched screen 34 continuously until a desired area of the surface of the pre-stretched screen 34 is exposed during the second relative movement. This is preferably performed in one minute or less, more preferably 30 seconds or less.

Finally, in one embodiment the source 54 is mounted on a pivot. As such, it can pivot between an "up" position during loading and unloading of the screen 34 and "down" position during exposure of the screen 34.

Figure 5:
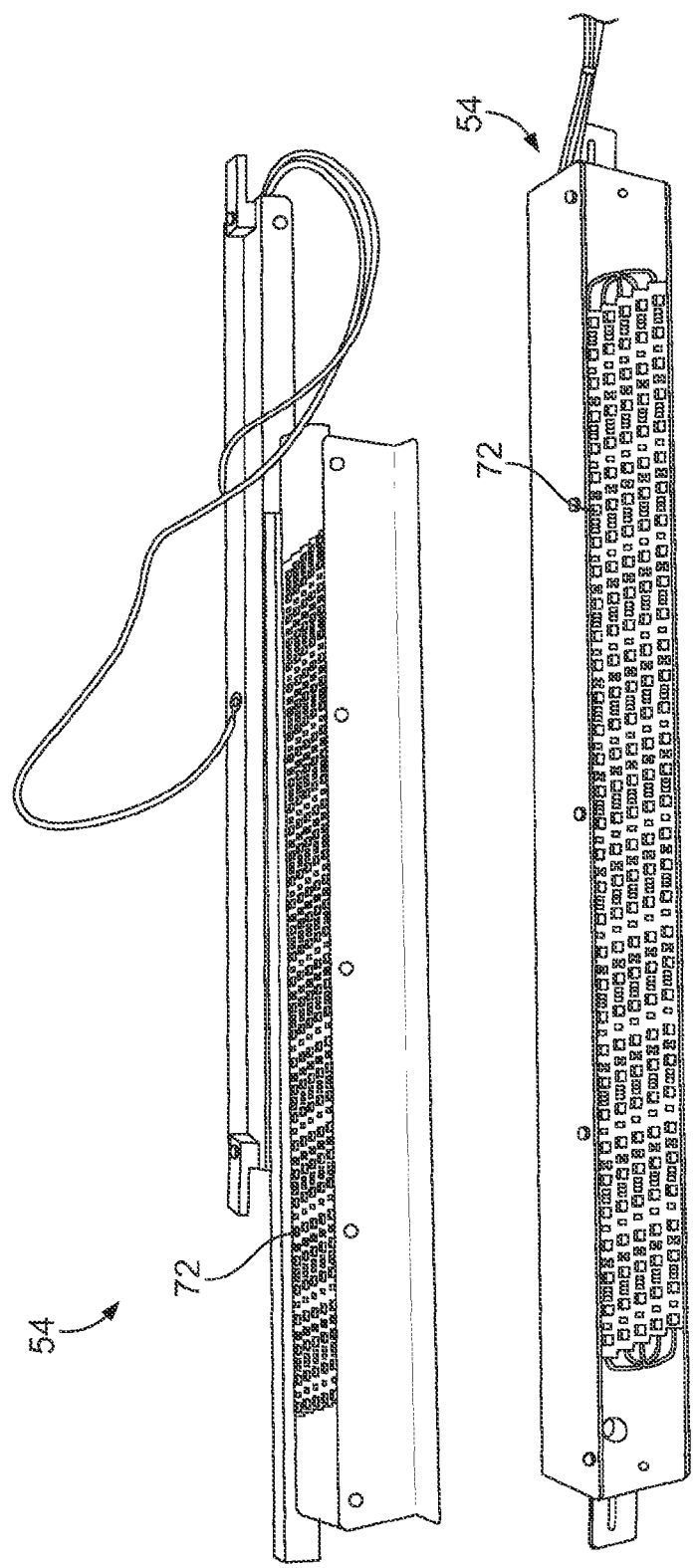
FIG. 5 is perspective view of a source of ultra-violet light removed from the apparatus showing a bank of light emitting diodes arranged in straight rows and angled columns to maximize exposure to the ultra-violet light.
Figure 6:
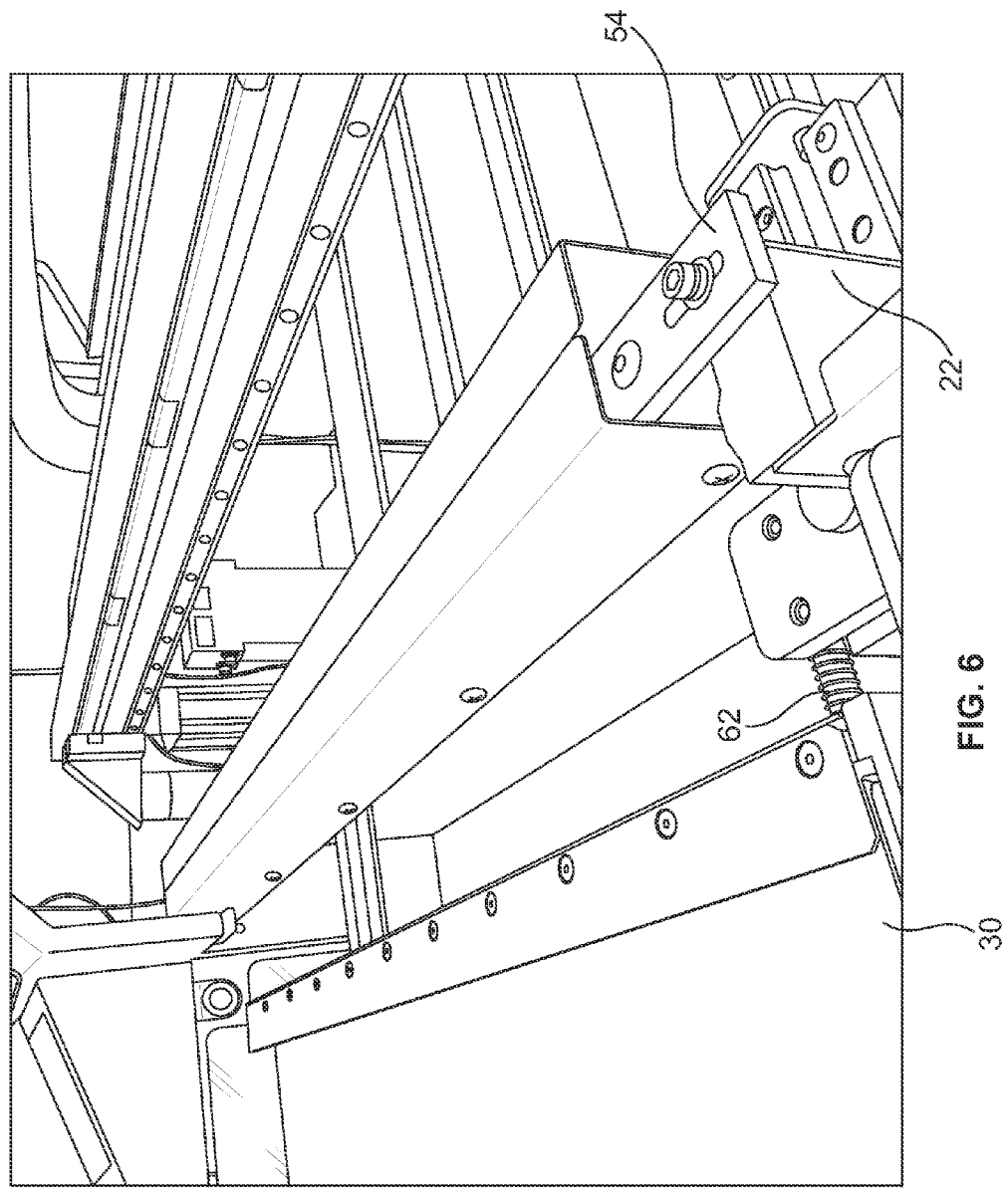
FIG. 6 is a partial perspective view of an embodiment of the present invention showing the source of ultra-violet light attached to a housing.
Figure 7:
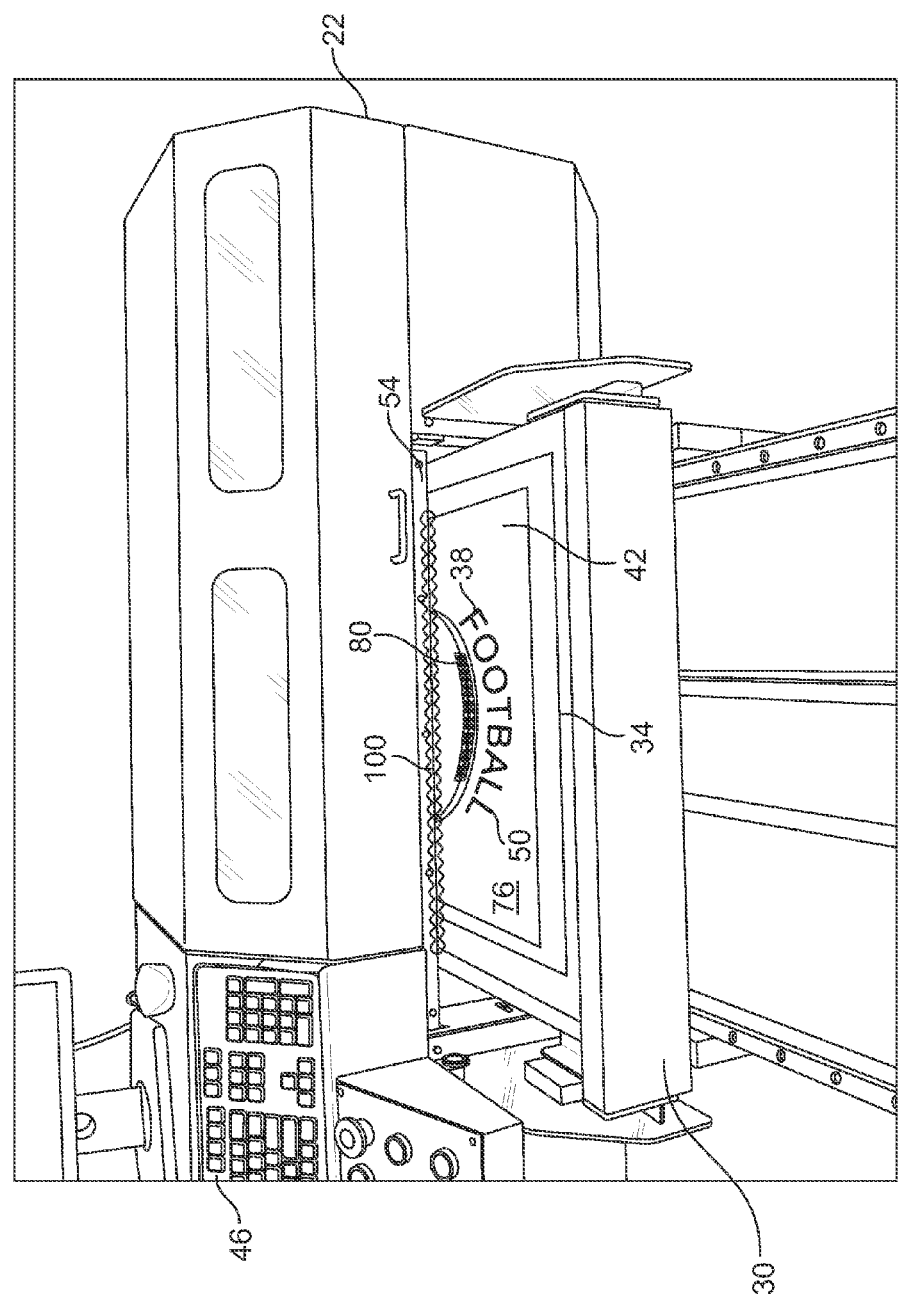
FIG. 7 is a front view of an embodiment of the present invention showing the apparatus in use as a pre-stretched screen coated with an ultra-violet light sensitive emulsion and printed with an ultra-violet light blocking agent undergoes exposure to an ultra-violet light.
Figure 8:
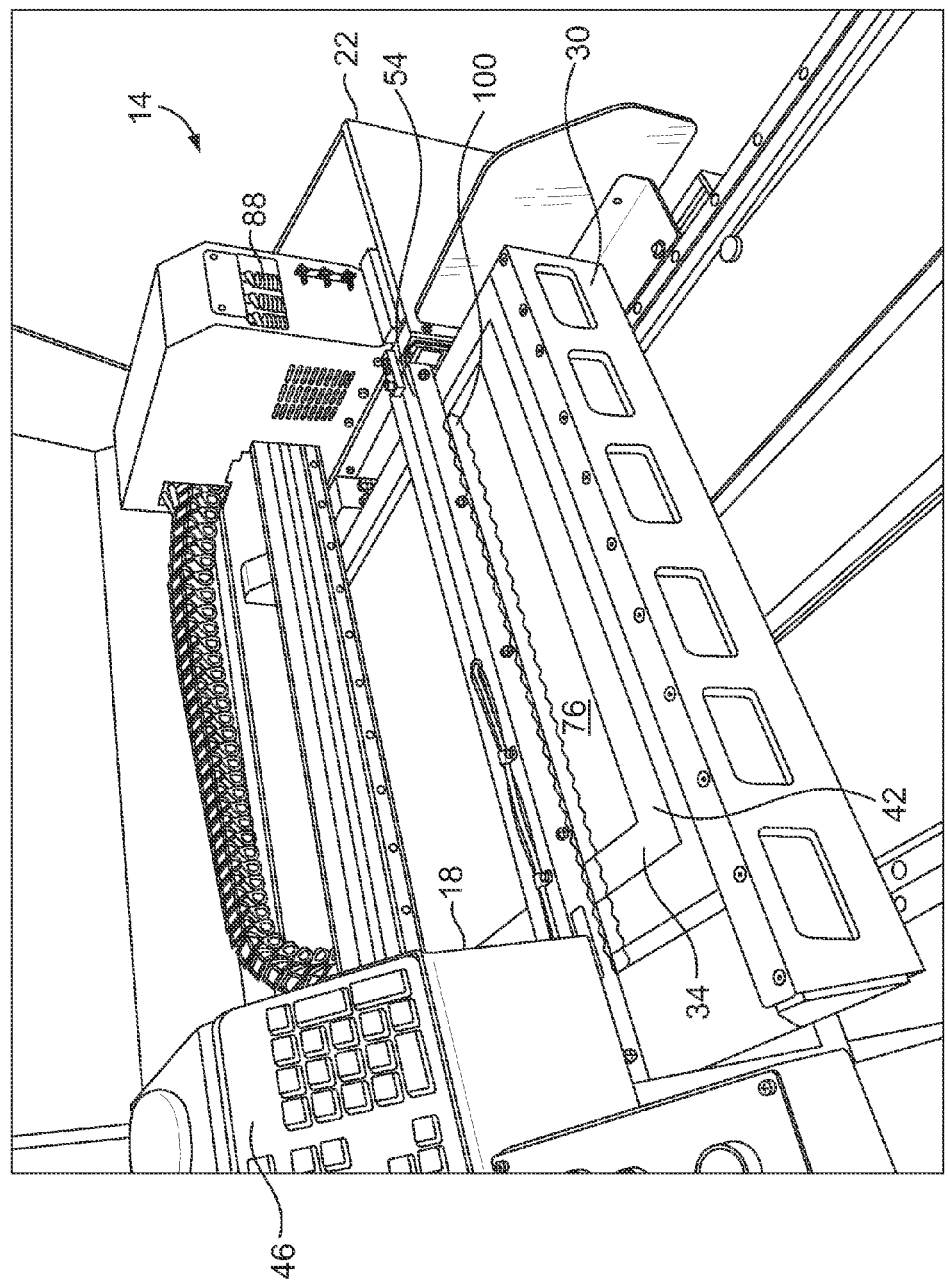
FIG. 8 is a partial perspective view of an embodiment of the present invention showing the apparatus in use as a pre-stretched screen coated with an ultra-violet light sensitive emulsion and printed with an ultra-violet light blocking agent undergoes exposure to an ultra-violet light with a shield on the housing lifted to show additional detail of the apparatus and process.
Figure 9:
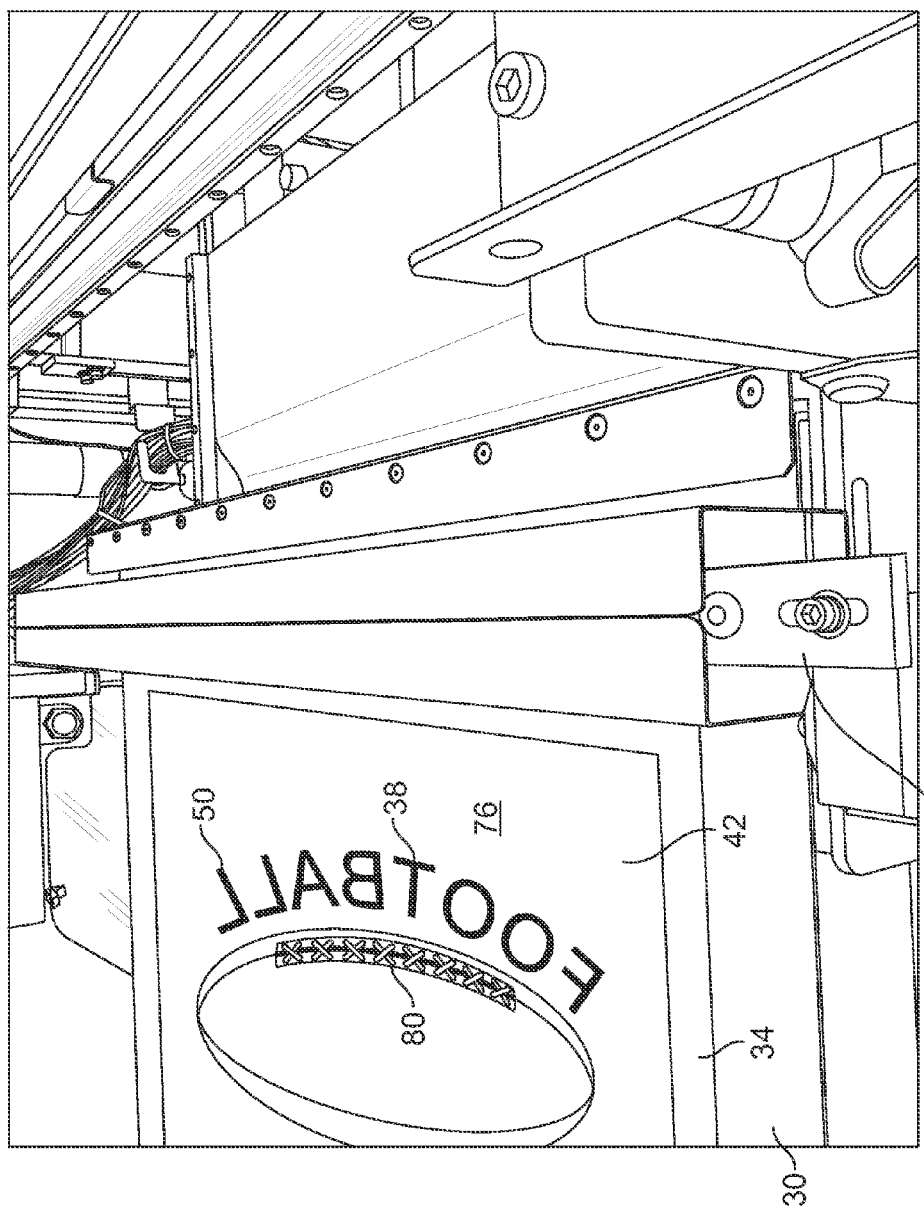
FIG. 9 is a partial perspective view an embodiment of the present invention showing the apparatus and a pre-stretched screen coated with an ultra-violet light sensitive emulsion and printed with an ultra-violet light blocking agent subsequent to exposure to the ultra-violet light.
Figure 10:
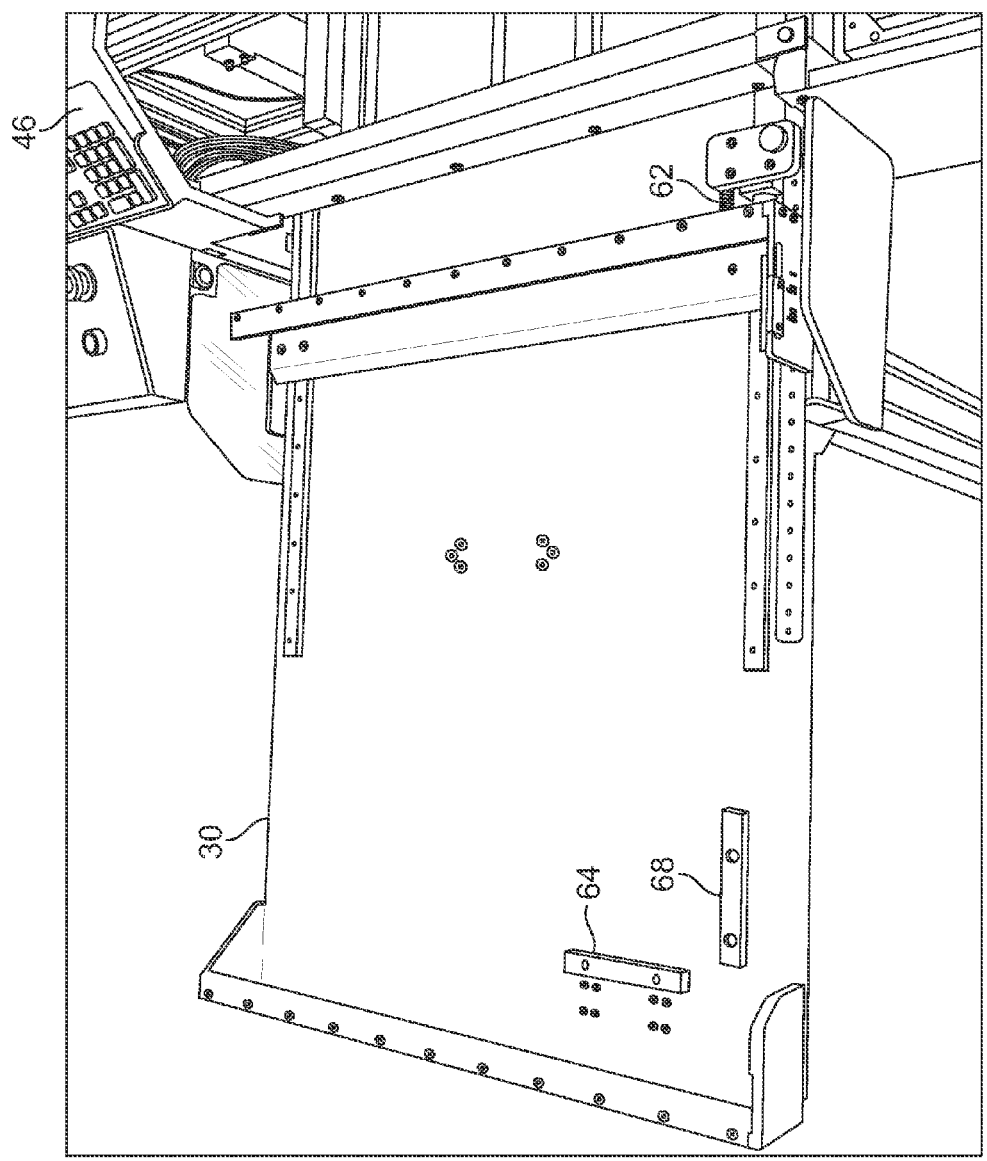
FIG. 10 is a partial perspective view of a screen bed on an embodiment of the present invention showing a 3-point registration system.
Figure 11:
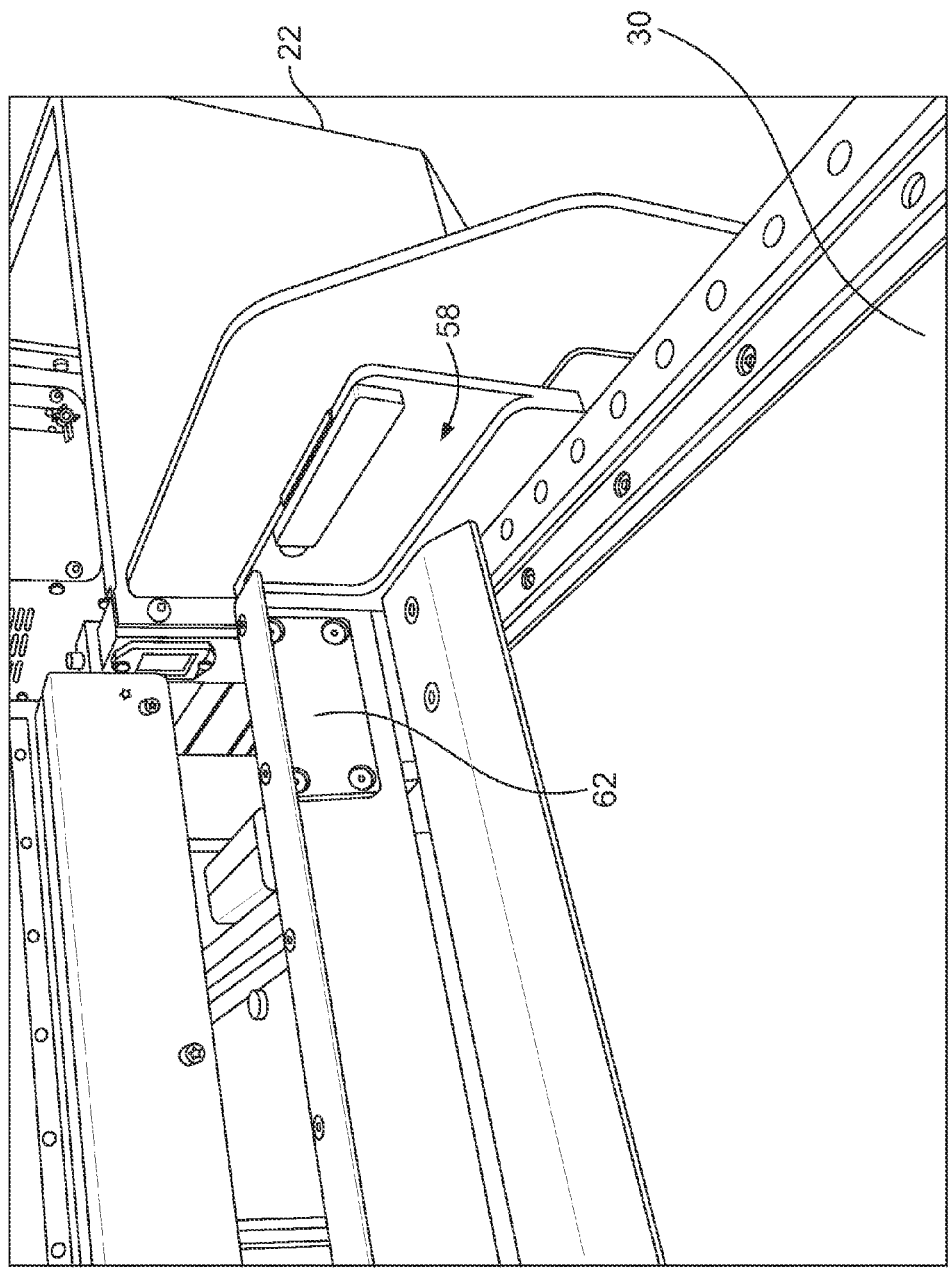
FIG. 11 is a partial perspective view of the screen bed showing a slot for receiving an edge of a pre-stretched screen.
Figure 12:
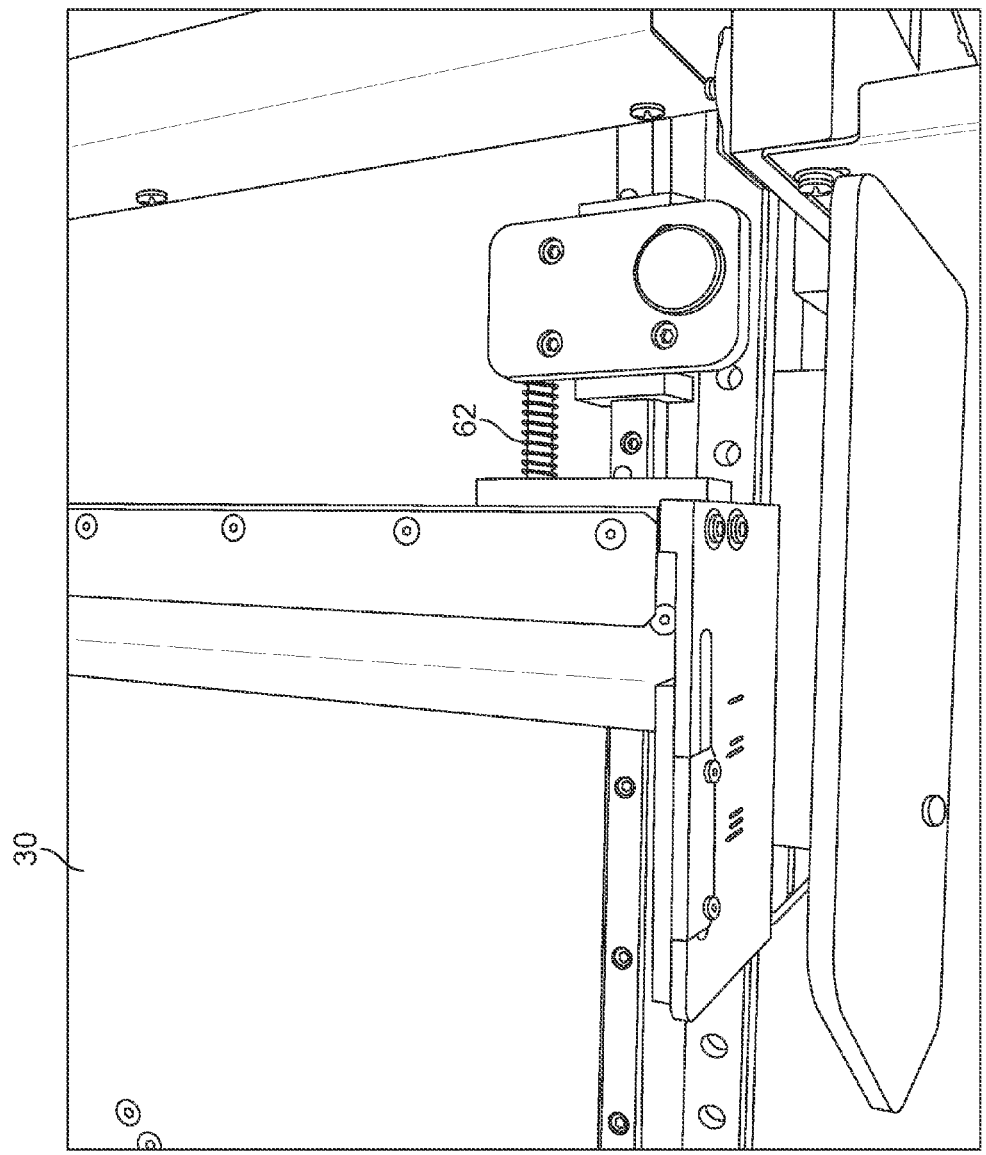
FIG. 12 is a spring-loaded member of the registration system.
Figure 13:
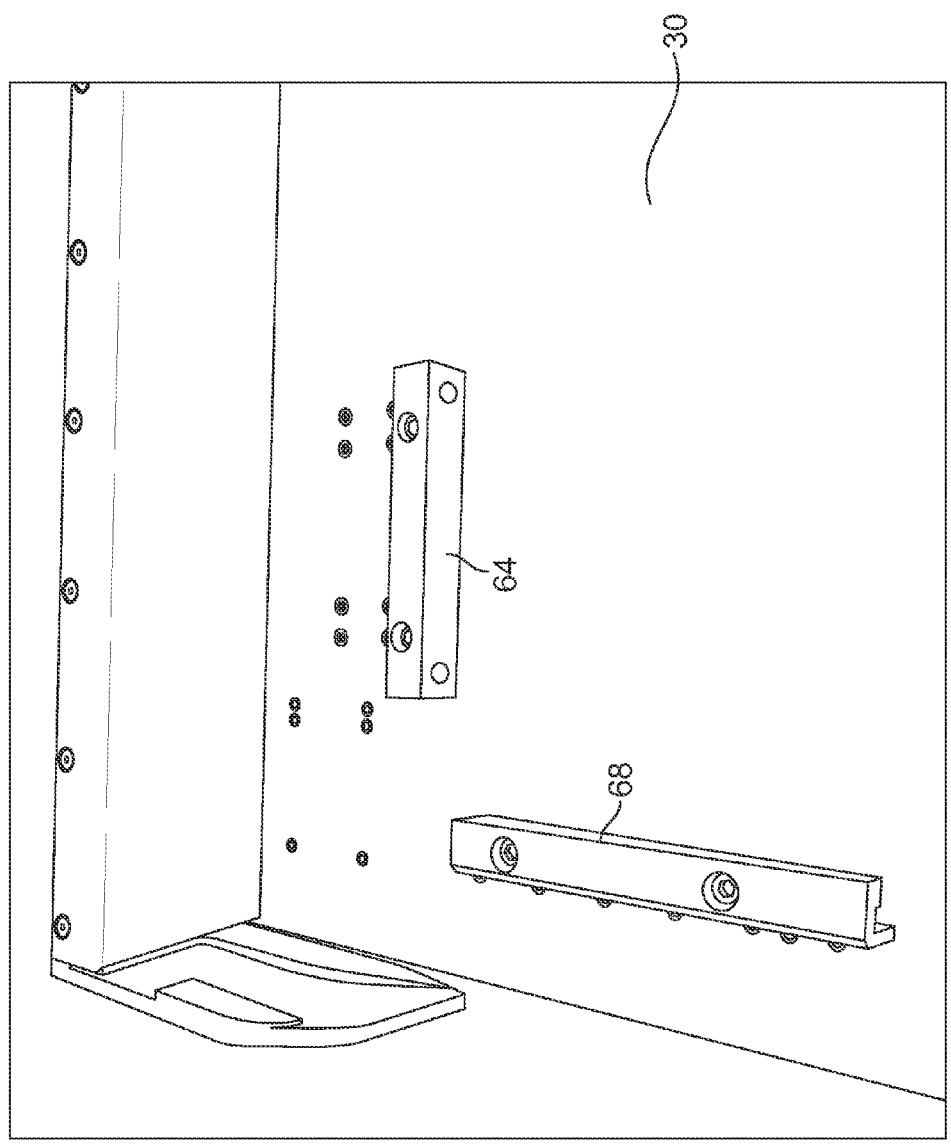
FIG. 13 is a view of retainers of the registration system arranged in a perpendicular orientation.

The source of ultra-violet light 54, preferably the LED arrangement shown in FIG. 5, is powered by an adjustable power supply. A photo-sensor monitors ultra-violet output of the LEDs and produces, or converts to, a DC signal which is looped back to a PLC. The PLC controls ultra-violet output from the LEDs 72.

The source of ultra-violet light 54 is controlled by the presence of a pre-stretched screen 34. Accordingly, the source of ultra-violet light 54 is not "on" unless a screen 34 is present. The apparatus uses a proximity switch to control the power to the source of ultra-violet light. This minimizes leakage.

The Process

As noted, the pre-stretched, emulsion coated screens 34 are individually loaded into a printer device/machine and registered on the bed 34. For each screen 34, the individual silhouettes 50 generated by the software for each color (and print head on the printing machine) are digitally printed on each emulsion coated screen 34. Each emulsion coated screen 34 is then exposed by the source of ultra-violet light 54 mounted on the machine. Each exposed screen 34 is next removed from the machine and processed by power spraying or by chemical reaction. Rinsing of the pre-stretched screen 34, thus, may be accomplished with a pressurized fluid subsequent to the exposing step wherein a portion of the ultra-violet light sensitive emulsion 42 that was exposed to the light 100 emitted by the source of ultra-violet light 54 remains on the pre-stretched screen 34 and a portion of the ultra-violet light sensitive emulsion 42 beneath the ultra-violet light blocking agent 38 is removed by the rinsing step. Each screen 42 finally dried mechanically, electronically, or naturally. Once dried, the screen 42 is ready for use on the printing machine.

The present development combines the teaching of those two products, and other teachings to accomplish an "all-in-one" system.

M&R Printing Equipment, Inc., assignee of the present invention, manufactures and sells a line of computer to screen imaging systems under the trademark i-IMAGE™, that being the i-IMAGE ST and a line of multi-spectrum screen exposure systems under the trademark TRI-LIGHT™, that being the TRI-LIGHT, TRI-LIGHT CTS, and TRI-LIGHT ST. Three i-IMAGE ST models are presently available: the i-IMAGE ST 1, with one industrial printhead capable of processing up to 150 screens per 8-hour shift; the i-IMAGE ST 2, with two industrial printheads for processing up to 250 screens per 8-hour shift; and, the i-IMAGE ST 3, with three industrial printheads for processing up to 350 screens per 8-hour shift. In fact, the i-IMAGE ST 3 can create a full-size image in as little as 30 seconds. All i-IMAGE ST models process image areas up to 51×53 cm (20"×21") and accept most static and retensionable screen frames in sizes up to 66×91 cm (26"×36").

The TRI-LIGHT CTS by M&R Printing System's NuArc's division exposes screens generated by a computer-to-screen (CTS) system. Exposures are powered by NuArc's multi-spectrum metal-halide System 631™, which idles at 1 kW and operates at user-selected settings of 6 kW, 3 kW and 1 kW. The 3 kW and 1 kW settings allow operators to slow down exposures when necessary. They also extend TRI-LIGHT's ability to adapt to future emulsion formulas. The system also features NuArc's exclusive Proportional Temperature Control (PTC). PTC continuously monitors lamp temperature, turning the cooling fans on and off to keep the lamp at the optimum operating temperature. The system can be located in areas housing unexposed screens because the light source and vacuum frame are enclosed, and the exposure lamp can't be turned on while the blanket frame is open.

In one embodiment, a design is entered into a computer 46. The design is separated into desired individual colors silhouettes 50. Each color silhouette 50 represents a separate or different color and a separate screen 34 to be printed with an ultra-violet light blocking agent 38. A surface of a pre-stretched screen 34 is coated with an emulsion 42, and the screen 34 is loaded onto a digital printing machine 10. The digital screen printing machine 10 then digitally prints or applies the ultra-violet light blocking agent 38 onto the emulsion-coated screen 34 in a pattern of a color silhouette 50. The emulsion-coated and digitally printed screen 34 is then exposed to an ultra-violet light emitted from a source of ultra-violet light 54. The source of ultra-violet light 54 is preferably associated with the digital printing machine 10 such that movement provided by the digital printing machine 10 to the screen 34 or the ultra-violet light 54 controls exposure of portions of the screen 34 continuously. The screen 34 is then removed from the digital printing machine 10 and processed by fluidly rinsing the screen.

In another embodiment, the digital printing machine 10 has a reservoir 88 which is capable of holding a quantity of an ultra-violet light blocking agent 38. An applicator, e.g. one or more print heads 26, is in fluid communication with the reservoir 88. A screen bed 30 is in operative alignment with the applicator. A source of an ultra-violet light 54 is in operative alignment with the screen bed 30. Digitally encoded data corresponding to a desired design, e.g. a color silhouette 50, is received by the digital printing machine 10 typically by way of an interface in electronic communication with a computer 46 having a memory and a software loaded thereon. The interface and the computer 46 may be provided as components of the digital printing machine 10. A pre-stretched screen 34 having an ultra-violet light sensitive emulsion coating 42 on a surface thereof can be loaded onto a screen bed 30 as described above. A first relative movement between the screen bed 30 and the applicator is provided while the screen 34 is on the screen bed 30. A quantity of the ultra-violet light blocking agent 38 is applied by the digital printing machine 10 via the applicator to the ultra-violet light sensitive emulsion coating 42 as the first relative movement is actuated. Subsequent to the first relative movement, a second relative movement between the screen bed 30 and the source of ultra-violet light 54 is actuated while the screen 30 is on the screen bed 34 and subsequent to the ultra-violet light blocking agent 38 application to the ultra-violet light sensitive emulsion coating 42. During the second relative movement, the ultra-violet light sensitive emulsion coating 42 and the ultra-violet light blocking agent 38 are exposed to a light emitted by the source of ultra-violet light 54.

In another embodiment, an apparatus for preparing a screen 34 for a screen printing machine comprises an interface for receiving electronic commands from a computer 46. The commands pertain to a color silhouette 50 for which a screen 34 is desired to be produced. The apparatus has a housing 14 which includes frames, supports, and enclosures for supporting, shielding, and protecting the inter-workings of the apparatus.

A reservoir 88 is supplied for holding a supply of an ultra-violet light blocking agent 38 attached to the housing 14. The reservoir 88 may be considered any fluid conduit which is used to supply the ultra-violet light blocking agent 38 to an applicator, such as a print head 26. It follows that a print head 26 is in fluid communication with the reservoir 88 and is either directly or indirectly attached to the housing 14.

A screen bed 30, which generally holds and registers the screen 34 to be printed, is alignable with the print head 26.

The apparatus includes a means for providing relative movement between the print head 26 and the screen bed 30 along a two dimensional plane attached to the housing 14. This may be motor and accompanying gears, belts, etc. that drives the screen bed 30. Alternatively, it may be a motor that drives the print head 26. However, preferably, this means for providing relative movement drives the screen bed 30 in a Y-Y direction and the print head 26 in an X-X direction. In this case, movements by the screen bed 30 and the print head 26 are coordinated to allow the ultra-violet light blocking agent 38 to be deposited on the screen 34 in the desired locations.

A source of ultra-violet light 54 is attached to the housing 14. The source of ultra-violet light 54 operates on a preferred wavelength. Rather than exposing and curing the fluid (i.e the ultra-violet light blocking agent 38) deposited by the print head 26, here, the source of ultra-violet light 54 operates on or exhibits a wavelength wherein a first region of a layer of an emulsion 42 deposited on an emulsion-coated, pre-stretched screen 34 substantially solidifies when exposed thereto and wherein a second region of the layer of emulsion 42 which is masked by the ultra-violet light blocking agent 38 remains at least substantially flowable when exposed thereto. This allows the ultra-violet light blocking agent 38 and the substantially flowable emulsion 42 to be rinsed, cleansed, or power washed from the screen using normal or typical screen preparation technique.

The terms "first," "second," "upper," "lower," "top," "bottom," etc. are used for illustrative purposes relative to other elements only and are not intended to limit the embodiments in any way. The term "plurality" as used herein is intended to indicate any number greater than one, either disjunctively or conjunctively as necessary, up to an infinite number. The terms "joined," "attached," and "connected" as used herein are intended to put or bring two elements together so as to form a unit, and any number of elements, devices, fasteners, etc. may be provided between the joined or connected elements unless otherwise specified by the use of the term "directly" and/or supported by the drawings. The phrase "substantially flowable" and variations thereof is intended to indicate a capability of being rinsed from the surface of the pre-stretched screen using a fluid under pressure or other chemical means. The phrase "substantially solidified" is intended to indicate an incapability of being rinsed from the surface of the pre-stretched screen using a fluid under pressure.

Many modifications and variations of the present invention are possible in light of the above teachings. It is, therefore, to be understood within the scope of the appended claims the invention may be protected otherwise than as specifically described.

What is claimed is:

1. An apparatus for preparing a screen for screen printing comprising:
   a housing having a screen bed for placement of a pre-stretched, ultraviolet sensitive emulsion coated screen in a rectangular frame, the frame including a first end, a second end opposing the first end, a first side and a second side opposing the first side;
   a registration system attached to the screen bed for positioning the frame, the registration system including a first retainer for contacting a first end of the frame, a second retainer perpendicular to the first retainer for contacting a side of the frame perpendicular to the first end, and an adjustable biasing mechanism having a vertical planar wall portion for contacting the second end of the frame, wherein the biasing mechanism includes a spring and wherein the vertical planar wall portion includes a horizontal planar wall portion connected to a top edge of the vertical planar wall portion, the horizontal planar wall portion configured to extend outward over the second end of the frame.

2. The apparatus of claim 1 further comprising a print applicator connected to the housing and aligned for printing the screen, the print applicator in fluid communication with a reservoir of an ultraviolet blocking agent.

3. The apparatus of claim 2 further comprising a source of ultraviolet light connected to the housing and aligned for exposing the screen to ultraviolet light.

4. The apparatus of claim 3 wherein the screen bed and attached registration system is moveable with respect to the print applicator and source of ultraviolet light.

5. The apparatus of claim 4 wherein the screen bed and attached registration system moves in a first direction relative to the print applicator.

6. The apparatus of claim 5 wherein the screen bed and attached registration system moves in a second direction relative to the source of ultraviolet light.

7. The apparatus of claim 1 wherein the vertical planar wall portion of the biasing mechanism extends across the entire second end of the frame.

8. The apparatus of claim 1 wherein the biasing mechanism includes a stop secured to the screen bed, wherein the spring is connected to the stop at one end and the barrier at an opposing end to enable the barrier to provide a force to the second end of the frame.

9. The apparatus of claim 8 wherein the stop can be moved from a first location on the screen bed to a second location on the screen bed.

10. The apparatus of claim 1 wherein the first retainer is parallel to the first end of the frame.

11. The apparatus of claim 1 wherein the first retainer can be positioned at a plurality of positions on the screen bed.

12. The apparatus of claim 1 wherein the vertical planar wall portion is biased outwardly relative to a print applicator.

13. The apparatus of claim 1 wherein the vertical planar wall portion forces the first end of the frame against the first retainer.

14. The apparatus of claim 1 wherein the vertical planar wall portion includes a side contacting portion for contacting a portion of the first side of the frame.

15. An apparatus for preparing a screen for screen printing comprising:
a housing having a screen bed for placement of a pre-stretched, ultraviolet sensitive emulsion coated screen in a rectangular frame, the frame including a first end, a second end opposing the first end, a first side and a second side opposing the first side;
a registration system attached to the screen bed for positioning the frame, the registration system including a first retainer for contacting a first end of the frame, a second retainer perpendicular to the first retainer for contacting a side of the frame perpendicular to the first end, and a biasing mechanism for contacting the second end of the frame, wherein the biasing mechanism includes a spring, wherein the biasing mechanism includes a barrier that contacts the second end of the frame, wherein the barrier includes a side contacting portion for contacting a portion of the first side of the frame, and wherein the side contacting portion of the barrier includes a slot for receiving a portion of the frame.

16. An apparatus for preparing a screen for screen printing comprising:
a housing having a screen bed for placement of a pre-stretched, ultraviolet sensitive emulsion coated screen in a rectangular frame, the frame including a first end, a second end opposing the first end, a first side and a second side opposing the first side;
a registration system attached to the screen bed for positioning the frame, the registration system including a first retainer for contacting a first end of the frame and a biasing mechanism having a spring-loaded barrier for contacting the second end of the frame, the barrier including a side contacting portion for contacting a first portion of the first side of the frame, wherein the side contacting portion of the barrier includes a slot for receiving a portion of the frame.

17. The apparatus of claim 16 further comprising a second retainer positioned to contact a second portion of the first side of the frame.

18. The apparatus of claim 16 wherein the first retainer is adjustably mounted on the screen bed.

* * * * *